(12) United States Patent
Wei et al.

(10) Patent No.: US 9,112,671 B2
(45) Date of Patent: Aug. 18, 2015

(54) GATED RING OSCILLATOR-BASED DIGITAL EYE WIDTH MONITOR FOR HIGH-SPEED I/O EYE WIDTH MEASUREMENT

(75) Inventors: Fangxing Wei, Folsom, CA (US); Subratakumar Mandal, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 13/976,485

(22) PCT Filed: Feb. 7, 2012

(86) PCT No.: PCT/US2012/024132
§ 371 (c)(1),
(2), (4) Date: Mar. 11, 2014

(65) Prior Publication Data
US 2014/0204988 A1    Jul. 24, 2014

(51) Int. Cl.
*H03K 3/03*    (2006.01)
*H04L 7/00*    (2006.01)
*H03K 5/13*    (2014.01)
*H03K 5/00*    (2006.01)

(52) U.S. Cl.
CPC .............. *H04L 7/0087* (2013.01); *H03K 5/133* (2013.01); *H03K 3/0315* (2013.01); *H03K 2005/00052* (2013.01)

(58) Field of Classification Search
CPC .................... H03K 2005/00052; H03K 5/133; H03K 5/1565; H03K 5/159; H03K 9/08; H03L 7/0814; H03L 7/091
USPC .......... 331/57; 375/220, 221, 316; 324/76.11; 702/79
See application file for complete search history.

(56) References Cited

U.S. PATENT DOCUMENTS

| | | | |
|---|---|---|---|
| 6,429,693 B1 | 8/2002 | Staszewski et al. | |
| 6,501,706 B1 | 12/2002 | West | |
| 7,679,459 B2 * | 3/2010 | Menolfi et al. | 331/57 |
| 2004/0170244 A1 | 9/2004 | Cranford, Jr. et al. | |
| 2005/0147194 A1 | 7/2005 | Koenenkamp | |
| 2005/0265487 A1 | 12/2005 | Sou | |
| 2006/0002497 A1 | 1/2006 | Zhang | |
| 2006/0103566 A1 | 5/2006 | Vemulapalli et al. | |
| 2006/0181319 A1 | 8/2006 | Zhang | |
| 2006/0227917 A1 | 10/2006 | Buchwald et al. | |
| 2006/0242367 A1 | 10/2006 | Ramakrishnan et al. | |

(Continued)

FOREIGN PATENT DOCUMENTS

WO    2013/119209 A1    8/2013

OTHER PUBLICATIONS

International Search Report and Written Opinion received for PCT Patent Application No. PCT/US2012/024132, mailed on Oct. 24, 2012, 12 pages.

(Continued)

*Primary Examiner* — Arnold Kinkead
(74) *Attorney, Agent, or Firm* — Carrie A. Boone, P.C.

(57) ABSTRACT

A novel digital eye width monitor (DEWM) system and method are disclosed. The DEWM system provides on-die capability to directly measure the left and right eye-width in picoseconds. The DEWM system measures the time from the phase interpolator (PI) clock position (data eye center, left edge, right edge) to a reference clock, and calculates the left and right eye width within a single-digit pico-second level of accuracy.

25 Claims, 9 Drawing Sheets

(56) References Cited

U.S. PATENT DOCUMENTS

| | | |
|---|---|---|
| 2007/0075877 A1 | 4/2007 | Goller et al. |
| 2008/0297213 A1 | 12/2008 | Abbasfar et al. |
| 2009/0202027 A1 | 8/2009 | Yin et al. |
| 2011/0068840 A1 | 3/2011 | Williams et al. |
| 2011/0075781 A1 | 3/2011 | Kenney |
| 2011/0084863 A1 | 4/2011 | Chiu et al. |
| 2011/0274215 A1 | 11/2011 | Hollis |
| 2014/0093014 A1 | 4/2014 | Wei et al. |

OTHER PUBLICATIONS

International Preliminary Report on Patentability and Written Opinion received for PCT Patent Application No. PCT/US2012/24132, mailed on Aug. 21, 2014, 9 pages.

* cited by examiner

GATED RING OSCILLATOR-BASED DIGITAL EYE WIDTH MONITOR FOR HIGH-SPEED I/O EYE WIDTH MEASUREMENT

TECHNICAL FIELD

This application relates to high-speed I/O links and, more particularly, to circuits performing measurements at a picosecond level of accuracy.

BACKGROUND

In high-speed input/output (I/O) links, an accurate measurement of the eye-width of the received signal is critically important. The output of a signal from a I/O Circuit transmitter is known commonly as an eye diagram. Eye diagrams helps to determine system level voltage and timing margin associated with a high speed I/O operation. The better the quality of the digital signal transmission, the wider the eye width and eye height will be.

In the current eye measurement technique, phase interpolator (PI) codes for eye center training are captured. After training, system margining is performed to push the clock edge to the right (or left) edge of the eye. A phase interpolator code for right (or left) edge of the eye is captured. The difference of phase interpolator codes between eye-center training and eye edge right (or left) is used to manually generate the right eye width (or left eye width) data in picoseconds. This process needs to refer to the phase interpolator differential non-linearity (DNL) characteristics collected through silicon validation processes.

The current eye measurement technique is a very tedious operation, involving a significant amount of manual labor. More importantly, to obtain highly accurate eye-width measurements, extensive silicon validation characterizations across multiple process/voltage/temperature variations would be required.

Other prior art eye measurement designs have flip-flop metastability issues, which affect the measurement precision.

Thus, there is a continuing need for an automated eye-width characterization method that overcomes the shortcomings of the prior art.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a novel digital eye width monitor (DEWM) system and method are disclosed. The DEWM system provides on-die capability to directly measure the left and right eye-width in picoseconds. The DEWM system measures the time from the phase interpolator (PI) clock position (data eye center, left edge, right edge) to a reference clock, and calculates the left and right eye width with 1-2 pico seconds of accuracy.

In the following detailed description, reference is made to the accompanying drawings, which show by way of illustration specific embodiments in which the subject matter described herein may be practiced. However, it is to be understood that other embodiments will become apparent to those of ordinary skill in the art upon reading this disclosure. The following detailed description is, therefore, not to be construed in a limiting sense, as the scope of the subject matter is defined by the claims.

Most of the high-speed I/O links use a phase interpolator-based training mechanism in a receiver (RX) circuit. This training mechanism is used to place the data sampling clock at the center of the valid window. This is followed by margining the phase interpolator (PI) clock, to the left and right, to measure the data eye width, and averaging the two sets of PI codes to find the received data eye center. The difference of the two sets (left and right) of the PI codes multiplied by the average PI step time gives the eye width. This is the conventional way to obtain the received eye width.

Because the PI DNL has a big variation over its code control range, the eye width measurement result typically has a big error, using this prior art technique.

Figure 1:
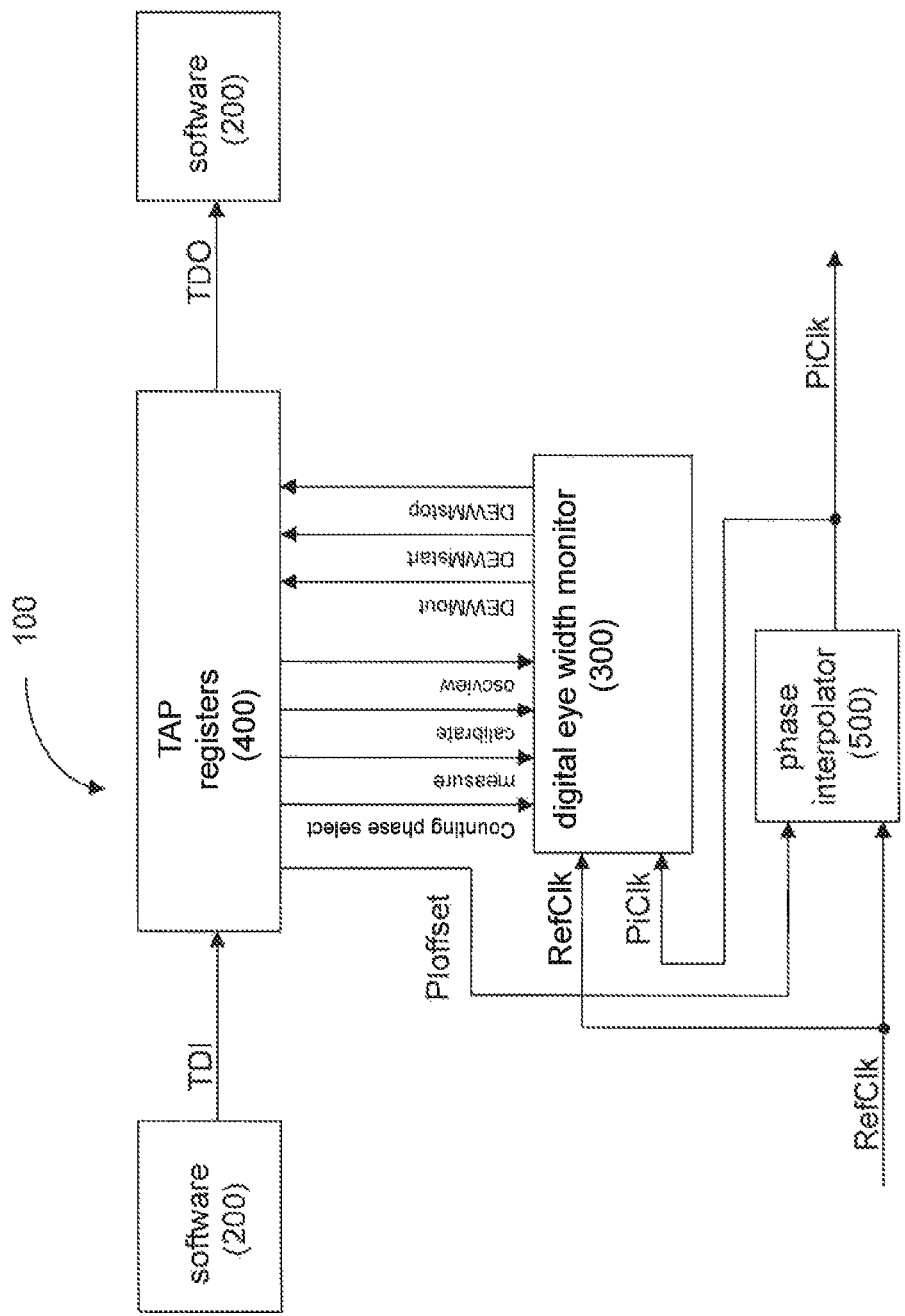
FIG. 1 is a simplified block diagram of a digital eye width monitor (DEWM) system, according to some embodiments.

The novel digital eye width monitor provides a new method to measure received data eye width, with a pico-second range precision. FIG. 1 is a simplified block diagram of a DEWM system 100, according to some embodiments. The DEWM system 100 includes a digital eye width monitor 300 (DEWM 300), which receives a reference clock (RefClk) and a phase interpolator clock (PiClk) as inputs, such that the DEWM 100 generates a digital value, DEWMout, as a timing measurement result. The digital result can be read out from digital registers through the control of an external control script (shown as software 200) from an output signal, shown as TDO.

The control script 200 initializes a test access port (TAP) controller, which includes programmable TAP registers 400. In some embodiments, the TAP controller is an on-chip device that controls the read and write operations to the tap register 400. These TAP registers 400 send a PI offset code to the phase interpolator 500, and a DEWM control code (counting phase select, measure, calibrate, and oscview), in response to receiving a test data input (TDI) signal from the software 200. The software 200 further reads out DEWM measurement results from the test data output (TDO) signal, which is also received into the software program 200.

Using the PIoffset signal and the TAP registers 400, the software 200 is able to offset the phase interpolator (PI) 500 to its left, right, and center positions, of the digital eye. The DEWM 300 is then able to measure the data eye width, based on these positions. The PI training algorithm is not part of this disclosure. The DEWM 300 uses the training results and measures the received data eye within a pico-second range precision. In some embodiments, the hardware of the DEWM system 100 is on-chip, while the software 200 of the DEWM system is off-chip, to form a full timing measurement function.

In some embodiments, the reference clock, RefClk, coming into the phase interpolator 500 and digital eye width monitor 300 is a stable clock operating at a known frequency and fixed phase. In some embodiments, the RefClk used in FIG. 1 is a 2 GHz clock. The phase interpolator clock, PiClk, is also a stable clock operating at the same frequency as RefClk, but the PiClk has changing phases.

The TAP system is a state machine using in testing systems under a joint test action group (JTAG). JTAG is the common name for what has been standardized as the IEEE 1149.1, "Standard Test Access Port and Boundary-Scan Architecture", where IEEE is short for the Institute of Electrical and Electronics Engineers. JTAG was initially devised for testing printed circuit boards using boundary scan and is still widely used for this application. In the system 100, the software 200, using the TAP registers 400, controls the position of the PiClk, thus enabling the DEWM 300 to do timing measurements. Other data bus accessible and programmable registers also can be chosen to control the DEWM measurement system.

Figure 2:
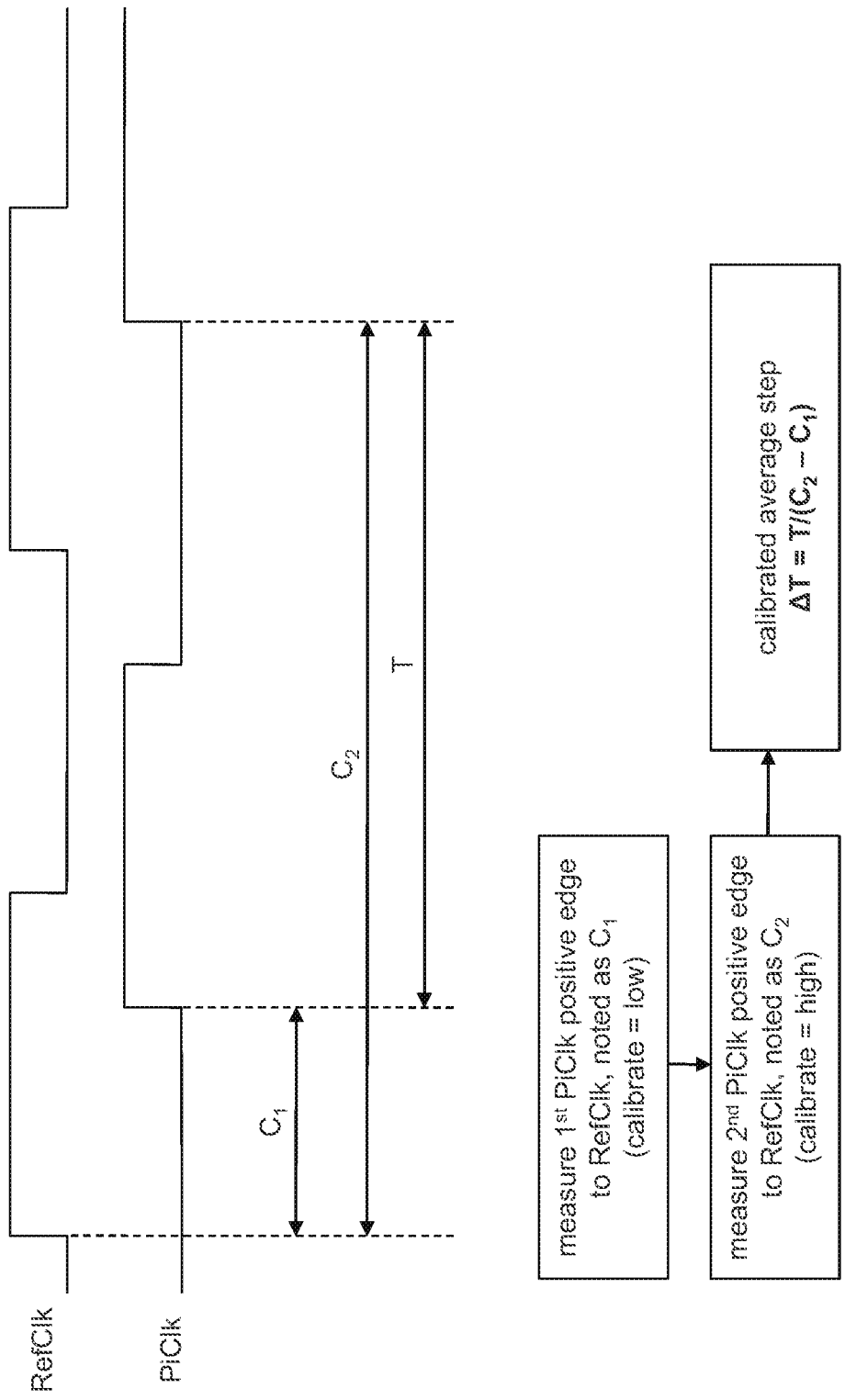
FIG. 2 is a diagram illustrating digital eye width measurement calibration performed by the DEWM system of FIG. 1, according to some embodiments.

The DEWM 300 of the system 100 generates digital outputs, shown in FIG. 1 as DEWMout, as timing measurement results for a received signal. To translate the digital results into pico-second time, an average timing measurement step needs to be extracted from the silicon validation, in some embodiments. This calibration process is shown in FIG. 2. The PI clock, PiClk, has a fixed frequency, the same frequency as RefClk from which it is derived, and PiClk is used as reference to calibrate the DEWM 300. For a fixed amount of time, T, the DEWM 300 can give a digital output (C2−C1) for it. The equation, T/(C2−C1), is the average step used to convert DEWM digital measurement outputs into a pico-second unit of time.

Figure 3:
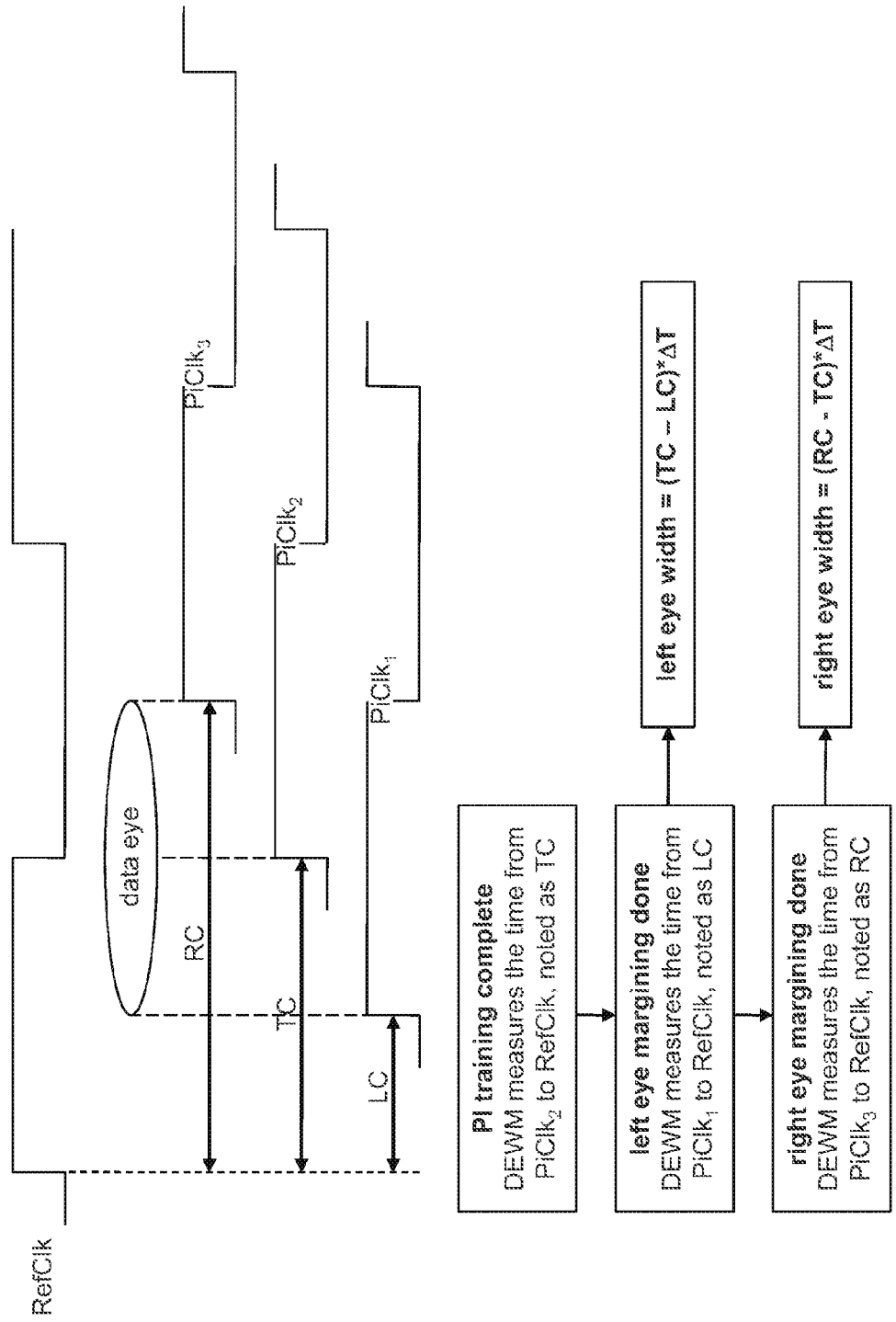
FIG. 3 is a diagram illustrating digital eye width measurement performed by the DEWM system of FIG. 1, according to some embodiments.

FIG. 3 provides insight into how the system 100 performs the eye width measurement, according to some embodiments. The top of the figure shows the reference clock, RefClk, and the incoming data eye. There is a circuit that enables the PI output clock, PiClk, to be moved to a desired location. In FIG. 3, the PiClk is placed at the left, center, and right of the received data eye. These positions are obtained by PI training sequences, and are not part of this disclosure. The system 100 just uses the PI training codes found from PI training process, reloads these codes to offset the PiClk to its trained left, center, and right position to do the measurement.

Three measurements are obtained by offsetting the PiClk to its three locations, in some embodiments, once at the beginning of the data eye (PICIk$_1$), once at the center of the data eye (PICIk$_2$), and once at the end of the data eye (PICIk$_3$). Once the three PICIk events occur, the system 100 is able to measure the width of the data eye. A first measure, denoted TC, is obtained by measuring the time from PICIk$_2$ to RefClk. A second measure, denoted LC, is obtained by measuring the time from PICIk$_1$ to RefClk. A third measure, denoted RC, is obtained by measuring the time from PICIk$_3$ to RefClk. From the three measurements, TC, LC, and RC, the left eye width is calculated as TC−LC and the right eye width is calculated as RC−TC. The subtractions, TC−LC and RC−TC are then multiplied with the average time step, Δt, from the calibration in FIG. 2, to give the left eye width and right eye width in picoseconds.

Figure 4:
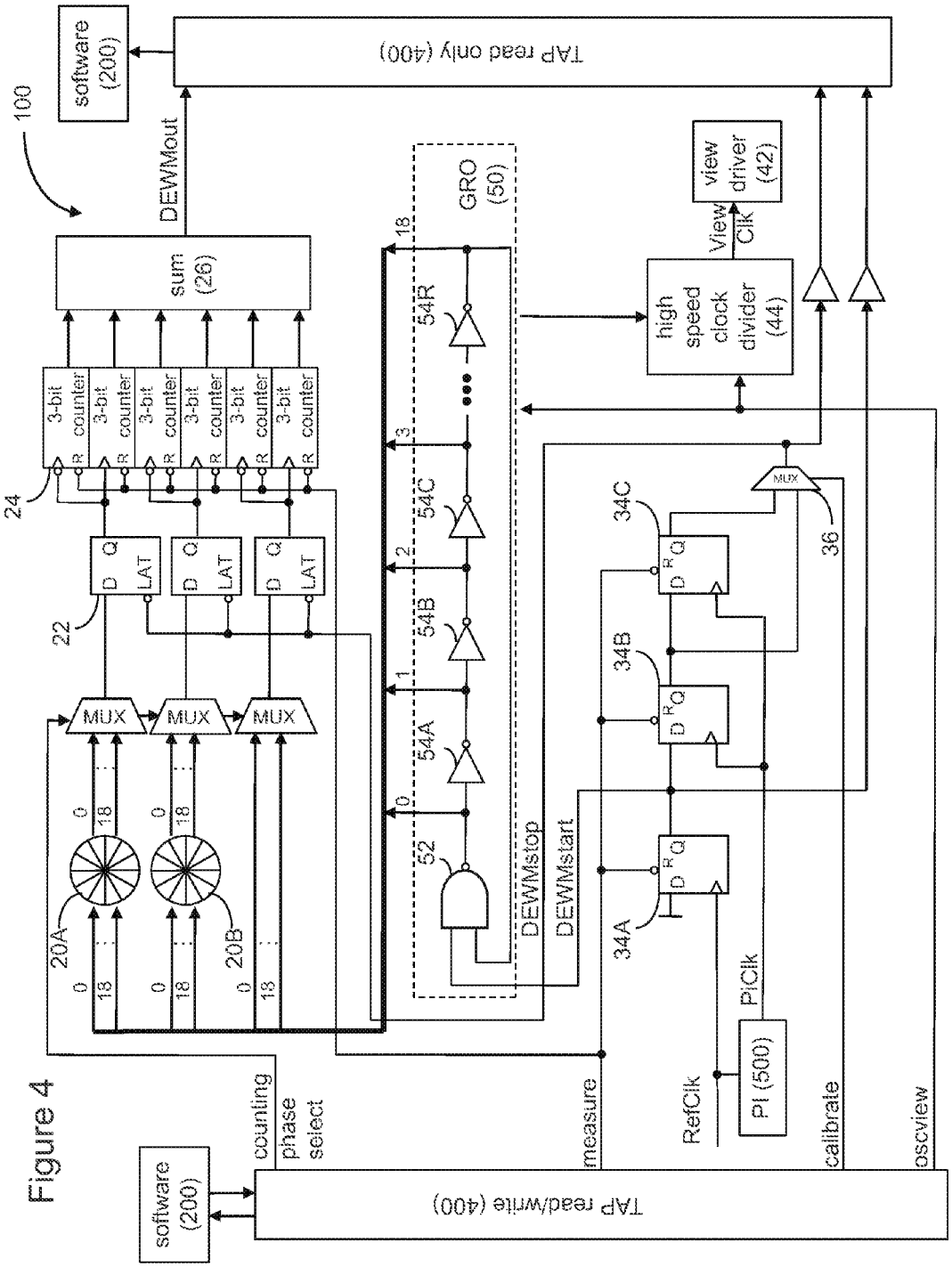
FIG. 4 is a detailed system block diagram of the DEWM system of FIG. 1, according to some embodiments.
Figure 5:
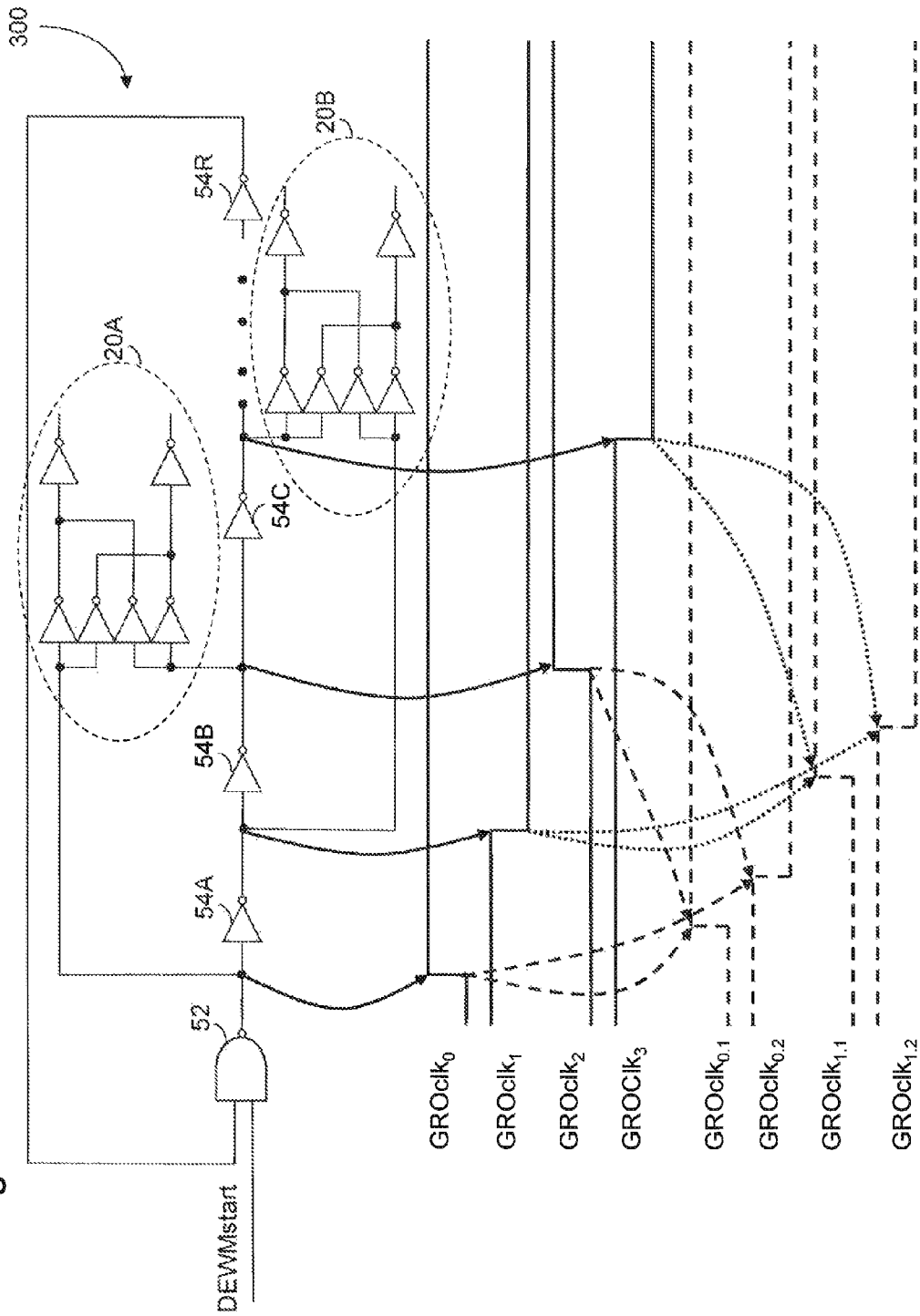
FIG. 5 is a timing diagram used to illustrate how the DEWM system of FIG. 1 employs standard cell-based phase interpolation to divide down the gate delay, according to some embodiments.

FIG. 4 is a detailed block diagram of the DEWM system 100, according to some embodiments. The DEWM system 100 includes a gated ring oscillator (GRO) 50 and standard cell-based interpolators 20A and 20B (collectively, interpolators 20), to achieve sub-gate delay to improve time measurement resolution. How this sub-gate delay is achieved is illustrated in FIG. 5, below. The phase interpolator 500 provides the phase interpolator clock (PICIk) needed to perform the eye width measurements by using RefClk as the reference.

The measurement process starts with a calibration cycle, in which the total number of rising and falling clock edges of the GRO 50 during one PiClk is measured. The DEWM 300 uses RefClk to trigger DEWMstart, to start the timing measurement, and uses PiClk to trigger DEWMstop, to finish the time measurement. Thus, looking at FIG. 3, for PiClk$_1$, the DEWM 300 counts all rising and falling clock edges produced by the GRO 50 between the rising edge of RefClk and PiClk$_1$, shown as LC. After resetting the DEWM 300, the DEWM 300 counts all rising and falling clock edges produced by the GRO 50 between the rising edge of RefClk and PiClk$_2$, shown as TC. Finally, after again resetting the DEWM 300, the DEWM 300 counts all rising and falling clock edges produced by the GRO 50 between the rising edge of RefClk and PiClk$_3$, shown as RC.

To count up all the rising and falling edges between the clocks, the DEWM 300 includes ripple counters 24. The ripple counters 24 count the number of clock rising and falling edges that show up during the time period to be measured, from DEWMstart low-to-high transition (triggered by RefClk) to DEWMstop low-to-high transition (triggered by PiClk). The DEWM 300 also uses an adder circuit 26 to sum up the total number of rising and falling edges counted by the ripple counters 24. This count number, shown as DEWMout, is used by the software 200 to determine the left/right eye width. In some embodiments, with different control flow of the software 200, the same set of hardware may be used to do clock duty cycle measurement, clock jitter measurement, and phase interpolator linearity check.

In some embodiments, the GRO of the DEWM 300 consists of an odd number of outputs. In FIG. 4, the GRO 50 consists of a NAND gate 52 and eighteen inverters 54A, 54B, . . . , 54R (collectively, inverters 54). An output precedes each inverter and follows the final inverter, for a total of nineteen outputs, denoted 0, 1, . . . 18. These nineteen outputs are received into the standard cell-based interpolators 20.

Because of this configuration, the GRO 50 of the DEWM 300 has an odd number of sequential clock phases (the outputs 0, . . . , 18). The GRO 50 thus guarantees that all GRO clock phases have a deterministic start from a fixed state with a repeatable sequence. This makes it possible to count the number of edges that occurred during the same time period to be measured for each GRO clock phase, using the same set of ripple counters 24 and adder circuit 26. In other words, because the clock phases of the GRO 50 have a deterministic start from a fixed state with a repeatable sequence, some of the hardware may be reused. The system 100 is thus designed to minimize the on-chip hardware to save silicon costs, yet offer sufficient hardware hooks to perform several different types of measurements, using external software control. The external software control gives flexibility to make a full use of the on-chip hardware resource to other possible applications.

An example of this hardware economy is illustrated in FIG. 4. The GRO 50 has nineteen outputs, labeled 0, . . . , 18. In an implementation where the cost and available real estate is not a concern, each of the nineteen outputs of the GRO 50 would be fed into a dedicated pair of phase interpolators 20A, 20B, which would each generate a new edge from two of the GRO clock phases. These added edges will improve DEWM measurement resolution, as shown in FIG. 5. Also, in some embodiments, the six ripple counters 24 are shared between the different phases coming out of the GRO 50, rather than having 114 of them (6 ripple counters×19 phases).

In some embodiments, the maximum gate delay inside the GRO 50 is about 6 picoseconds (ps). Thus, in some embodiments, the time measurement resolution is 6 ps. In order to achieve sub-gate delay resolution for performing the time measurements, standard cell-based phase interpolation is used to further divide down the gate delay, in some embodiments. In FIG. 5, two standard cell-based interpolators are used to divide the gate delay by one-third, to achieve a 2 ps timing measurement resolution.

FIG. 5 shows how two new edges are obtained in the DEWM 300, which are added for each gate delay inside the GRO 50. The GRO 50 consists of the NAND gate 52 and eighteen inverters 54A-54R (collectively, inverters 54). As introduced in FIG. 4, the cell-based interpolators 20A and 20B are used to divide down the gate delay. One of the cell-based interpolators 20A follows the second inverter, while the other interpolator 20B follows the third inverter, and so on (collectively, circuits 20). Nineteen of these circuits 20A and 20B are similarly distributed along the nineteen stage GRO 50 to generate new edges. The circuits 20 are added to further divide down the GRO gate delay. In some embodiments, the addition of the circuits 20 (two interpolators repeated nineteen times), following all GRO inversion stages, modifies the time resolution to about one third of the GRO gate delay, or about 2 ps.

To illustrate how the circuits 20 divide the GRO gate delay down, the GRO clock is shown as four separate clocks, denoted $GROclk_0$, $GROclk_1$, $GROclk_2$, and $GROclk_3$, with $GROclk_0$ showing the rising edge, $GROclk_1$ showing the falling edge, $GROclk_2$ showing the next rising edge, and $GROclk_3$ showing the next falling edge of the GRO clock. Arrows extending from the GRO 50 denote the part of the circuit producing each edge, with the first and third down-facing solid arrows denoting the rising edges ($GROclk_0$ and $GROclk_2$) and the second and fourth down-facing solid arrows denoting the falling edges ($GROclk_1$ and $GROclk_3$).

With the inclusion of the circuit 20A following the inverter 54B in the GRO 50, two new clock edges, denoted $GROclk_{0.1}$ and $GROclk_{0.2}$, are essentially inserted between $GROclk_0$ and $GROclk_1$, with the first rising edge ($GROclk_0$) and the second rising edge ($GROclk_2$) producing the two new clock edges, as indicated by the dashed arrows. Similarly, the insertion of the circuit 20B in the GRO 50, following the inverter 54C causes two new clock edges, denoted $GROclk_{1.1}$ and $GROclk_{1.2}$, to be inserted between $GROclk_1$ and $GROclk_2$, with the first falling edge ($GROclk_1$) and the second falling edge ($GROclk_3$) producing the two new clock edges, as indicated by the dotted arrows. This process is repeated for all succeeding inverters 54 in the GRO 50. The circuits 20 thus have the effect of dividing down the GRO clock, GROclk, to one third of its time resolution. In some embodiments, the time resolution of the GRO clock may be further divided down, to one fourth of its time resolution, one fifth of its time resolution, and so on.

Assuming the GRO 50 has an odd number, N, of stage delay elements (with N=19 in the DEWM 300 of FIG. 4), the GRO 50 will thus have 2*N total rising and falling edges (38 rising and falling edges). The two interpolators 20 for each GRO delay element will triple the rising and falling edges to 6*N (114 rising and falling edges).

Figure 6:
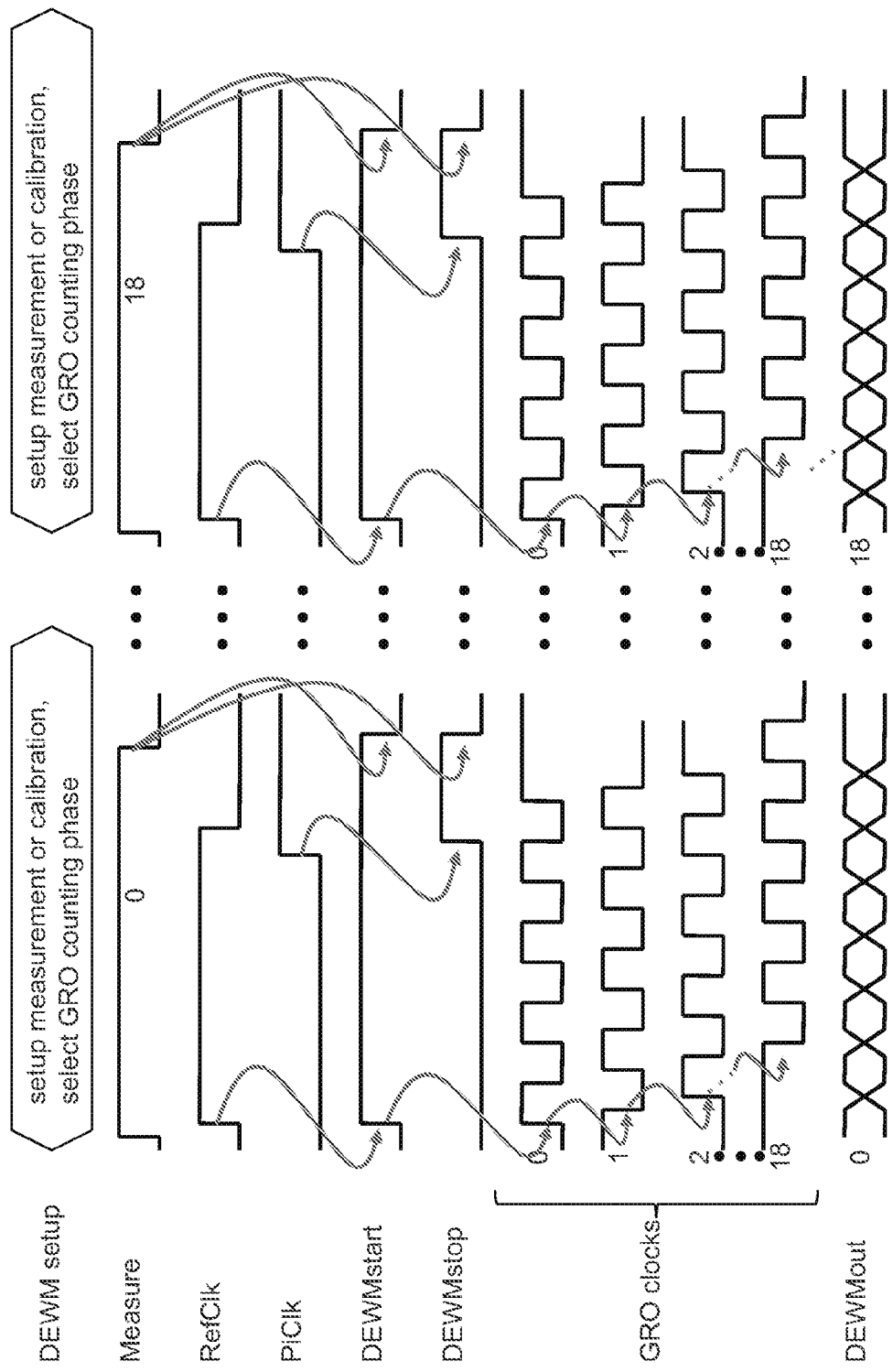
FIG. 6 is a diagram of the operation waveforms of the DEWM system of FIG. 1, according to some embodiments.

FIG. 6 shows the operation waveforms of the DEWM system 100, according to some embodiments. The reference clock, RefClk, triggers the GRO 50 to start the oscillation from the same known state for each GRO clock phase. As shown also in FIG. 4, of the GRO clock phases, denoted 0, 1, . . . , 18, one of them will be selected to pass through the latches 22 as GRO counting edges to clock the ripple counters 24. At the same time, the PiClk produced by the phase interpolator 500, after passing through D flip-flop 34 and MUX 36, triggers DEWMstop to transit from low to high, which will stop the latches 22 to pass GRO counting clock edges to the ripple counters 24.

In FIG. 6, GRO clock phase 0 is selected to clock ripple counters. After both DEWMstart and DEWMstop signals go high, DEWMout is read out through the TAP registers 400, denoted as "0". The signal, Measure, is reset to low to reset both the DEWMstart and DEWMstop signals to low. Then, the GRO clock phase 1 to 18 will be selected, one by one, to clock the shared ripple counters 24, until all nineteen GRO clock phases from the GRO 50 are counted in the same time measurement interval. The DEWMout signal, read out from the TAP registers 400, is denoted as "0", "1", . . . , "18" in FIG. 6. Then, all nineteen sets of ripple counter outputs are summed as the final timing measurement result, DEWMout.

In some embodiments, the ripple counters 24 are shared to count for different GRO clock phases, thus minimizing the real estate that is needed for the DEWM 300. In some embodiments, the ripple counter outputs are summed as a time measurement output. Also to conserve hardware, in some embodiments, all DEWM control inputs (counting phase select, measure, calibrate, and oscview) are generated using the writable TAP registers 400. The DEWM GRO clock edge counting number and its internal status bits (DEWMstart and DEWMstop) are sent to read-only TAP register bits, also found in the TAP registers 400. External software 200 operates the on-chip DEWM circuit through an on-chip TAP controller (not shown), which controls the read and write operations to the tap register 400. Each GRO clock phase and its two interpolated clock edges are selected from the total N GRO clock phases and their 2*N interpolated clock edges, using the software 200, to count the number of rising and falling edges that show up in the time interval to be measured. In some embodiments, the N groups of counted edge numbers are added up by the software 200 as the final timing measurement result.

Figure 7A:
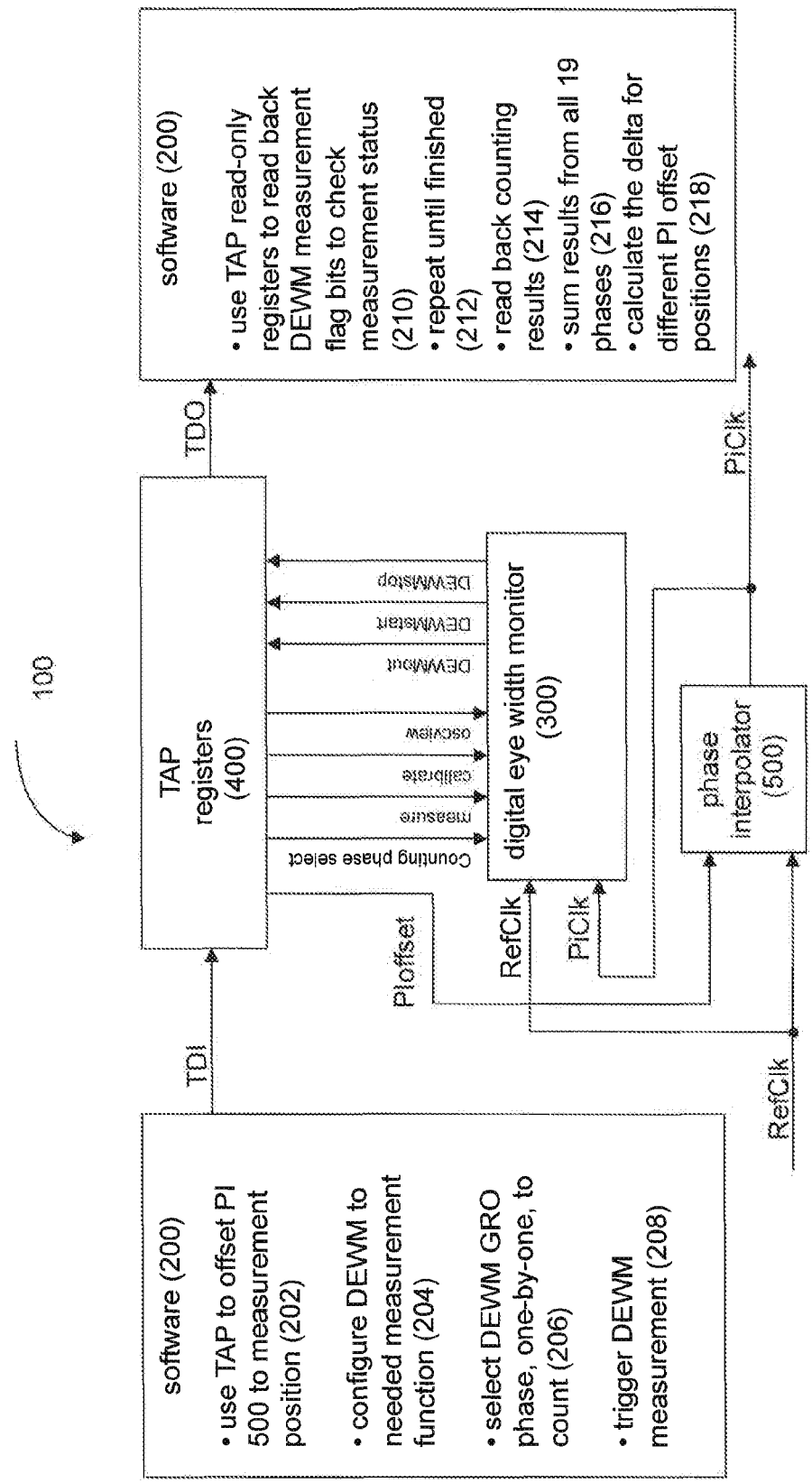
FIGS. 7A and 7B are a simplified block diagram and a flow diagram, respectively, showing operations of the DEWM system of FIG. 1, according to some embodiments.
Figure 7B:
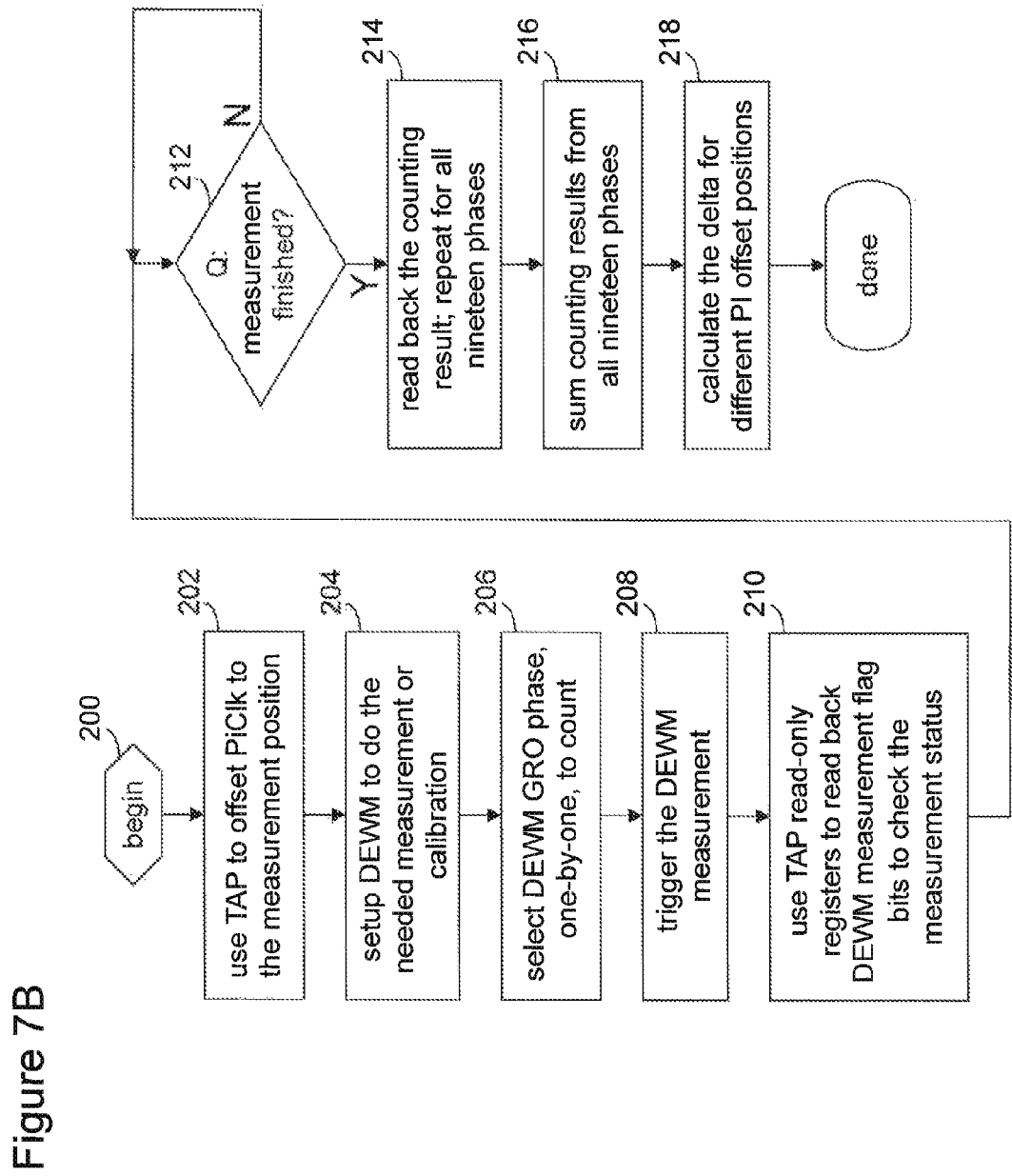

FIGS. 7A and 7B are—high-level flow diagrams of operations performed by the DEWM system 100 of FIG. 1, according to some embodiments. As particularly illustrated in FIG. 7A [FIG. 7], the software 200 is involved with the calculation, both at the initialization stage (left side, TDI) and the results stage (right side, TDO). First, the DEWM system 100 uses the TAP registers 400 to offset the PiClk to the measurement position (block 202). Recall that the software 200 is able to use the PIoffset signal and the TAP registers 400 to offset the PI 500 to its left, right, and center positions of the digital eye. Thus, the DEWM system 100 positions PiClk to a desired position, relative to the digital eye (FIG. 3). Once the position is established, the DEWM 300 is set up to do measurement or calibration (block 204). All DEWM GRO clock phases are selected, one by one, to count (block 206). Then, the DEWM measurement takes place, with the TAP registers 400 controlling the counting phase select signal (FIG. 4) (block 208). The read-only registers of the TAP 400 are used to read back the DEWM measurement flag bits (DEWMstart and DEWMstop), to check the measurement status (block 210).

Until the measurement is completed, no other operations are performed (block 212). Once completed, the read-only registers of the TAP controller are used to read back the DEWM measurement result (DEWMout, the counting results), and this operation is performed for all nineteen phases of the GRO 50 (block 214). The counting results are then summed for all nineteen phases (block 216) and the difference (delta) is calculated for different PI offset positions (block 218), such as left data eye, or right data eye.

Figure 8:
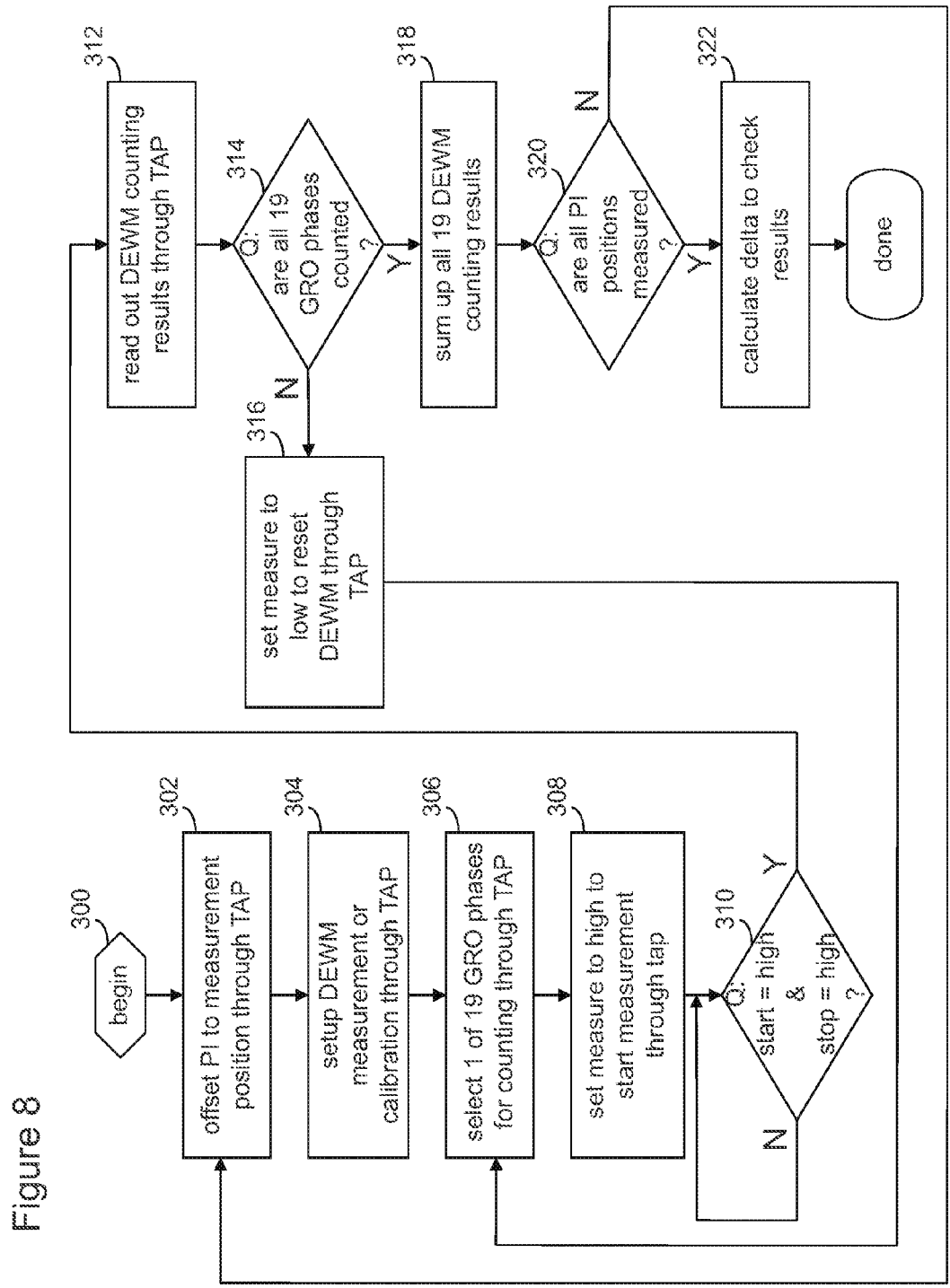
FIG. 8 is a flow diagram showing operations of the software in the DEWM system of FIG. 1, according to some embodiments.

FIG. 8 shows the operations performed by the software 200 of the DEWM system 100, as a flow diagram, in obtaining the data eye width measurement, according to some embodiments. Many of the steps shown in FIG. 8 are similar to the ones shown in FIGS. 7A and 7B. The software 200 first offsets the PI clock, PiClk, to the measurement position through the TAP registers 400 (block 302). The software 200 next sets up the DEWM measurement through the TAP registers 400 (block 304). Then, the software 200 selects one of nineteen phases of the GRO 50 through the TAP registers 400, and sends the selected signal to the ripple counters for counting (block 306). The software 200 sets measure to high to start the measurement through the TAP controller 400 (block 308). If the start=high and the stop=high (block 310), then the software 200 reads out the DEWM counting results (DEWMout) through the TAP registers 400 (block 312). If all nineteen phases of the GRO 50 are not counted, the measure is set to low to reset the DEWM 300 through the TAP registers 400 (block 316). A next phase of the GRO 50 is then selected for counting through the tap registers 400 (block 306) and the process repeats.

Otherwise, if all nineteen phases of the GRO 50 are counted (block 314), then the nineteen DEWM counting results are added together (block 318). If all the phase interpolation positions have been measured (block 320), then the differences are calculated to check the results (block 322). Otherwise, a new phase interpolator position is selected (block 302) and the process is repeated.

The flow diagrams in FIGS. 7A, 7B, and 8 describe operations of the DEWM system 100 in calculating the eye width of a received signal. By changing the flow diagrams, which describes the software portion 200, the same set of on-chip hardware may be employed for other measurement functions.

The range of the timing measurement is decided by the number of ripple counter stages, in some embodiments. This range may be easily extended by attaching one or more stages to the ripple counter to double the timing measurement range without any design timing issue.

In some embodiments, the DEWM system 100 provides support for manufacturers interested in reducing the product development cycle time, by reducing the total processing time of the post-silicon electrical validation tests. In some embodiments, a 15% improvement in post-silicon total processing time for electrical validation tests is expected. Several manual measurements will be replaced by the automated data collection procedure disclosed above.

Further, in some embodiments, the DEWM system 100 is helpful in determining the unit per million specifications more accurately in the face of growing challenges offered by phase interpolator circuit repeatability issues. Where in the prior art, an extra guard band is inserted in the system timing margin, due to the presence of phase interpolator repeatability, the DEWM system 100 obviates the need to address guard banding issues.

While the application has been described with respect to a limited number of embodiments, those skilled in the art will appreciate numerous modifications and variations therefrom. It is intended that the appended claims cover all such modifications and variations as fall within the true spirit and scope of the invention.

We claim:

1. A system, comprising:
    a phase interpolator to receive a reference clock and generate a phase interpolator clock;
    a digital eye width monitor to receive the reference clock and the phase interpolator clock, the digital eye width monitor to measure a width of a digital eye being received into the system, the digital eye width monitor further comprising:
        a gated ring oscillator to generate an odd number of sequential clock phases having a predetermined gate delay between each sequential clock phase, wherein all sequential clock phases have a deterministic start from a fixed state with a repeatable sequence; and
        a software program to control a position of the phase interpolator clock relative to the digital eye, wherein a rising edge of the reference clock causes the gated ring oscillator to start and a rising edge of the phase interpolator clock causes the gated ring oscillator to stop;
    wherein the digital eye width monitor counts all rising and falling clock edges of the sequential clock phases while the gated ring oscillator is operating.

2. The system of claim 1, wherein the predetermined gate delay between each sequential clock phase is about six picoseconds.

3. The system of claim 1, further comprising:
    first and second cell-based interpolators coupled to a first odd-numbered clock phases and a second odd-numbered clock phase of the gated ring oscillator, the first and second cell-based interpolators to:
        generate a first rising edge clock following the first odd-numbered clock phase; and
        generate a first falling edge clock following the first rising edge clock; and
    third and fourth cell-based interpolator coupled to a first even-numbered clock phases and a second even-numbered clock phase of the gated ring oscillator, the third and fourth cell-based interpolators to:
        generate a second rising edge clock following the first even-numbered clock phase; and
        generate a second falling edge clock following the second rising clock edge;
    wherein the second rising and falling edge clocks generated by the third and fourth cell-based interpolators causes the predetermined gate delay of the gated ring oscillator to be about two picoseconds.

4. The system of claim 1, further comprising:
    a first cell-based interpolator coupled to a first odd-numbered clock phases and a second odd-numbered clock phase of the gated ring oscillator, the first cell-based interpolator to:
    generate a first rising edge clock following the first odd-numbered clock phase; and
    a second cell-based interpolator coupled to a first even-numbered clock phases and a second even-numbered clock phase of the gated ring oscillator, the second cell-based interpolator to:
        generate a second rising edge clock following the first even-numbered clock phase; and
    wherein the first and second rising edge clocks generated by the first and second cell-based interpolators causes the predetermined gate delay of the gated ring oscillator to be about three picoseconds.

5. The system of claim 3, further comprising:
a first latch feeding into a first pair of three-bit counters, the first latch to receive first rising and falling edge clocks from a selected one of nineteen gated ring oscillator clock phases;
a second latch feeding into a second pair of three-bit counters, the second latch to receive the rising and falling edge of the first interpolated clock from the selected one of the nineteen gated ring oscillator clock phases; and
a third latch feeding into a third pair of three-bit counters, the third latch to receive the rising and filling edge of the second interpolated clock from the selected one of nineteen gated ring oscillator clock phases.

6. The system of claim 1, the digital eye width monitor to calibrate an average step between the reference clock and the phase interpolator clock by:
measuring a first phase interpolator clock rising edge to a rising edge of the reference clock to produce a first value, $C_1$, wherein the reference clock rising edge occurs before the phase interpolator clock rising edge;
measuring a second phase interpolator clock rising edge to the rising edge of the reference clock to produce a second value, $C_2$; and
calculating the average step, $\Delta T$, using the following formula:
$\Delta T = T/(C_2 - C_1)$, wherein T is the period of the phase interpolator clock.

7. The system of claim 6, the digital eye further comprising a left location, a center location, and a right location;
wherein the software program further:
offsets the phase interpolator clock to the center location of the digital eye, denoted $PiClk_2$;
measures the time, TC, from $PiClk_2$ to the reference clock, wherein the rising edge of the reference clock occurs before the rising edge of the $PiClk_2$;
offsets the phase interpolator clock to the left location of the digital eye, denoted $PiClk_1$;
measures the time, LC, from $PiClk_1$ to the reference clock, wherein the rising edge of the reference clock occurs before the rising edge of the $PiClk_1$;
offsets the phase interpolator clock to the right location of the digital eye, denoted $PiClk_3$;
measures the time, RC, from $PiClk_3$ to the reference clock, wherein the rising edge of the reference clock occurs before the rising edge of the $PiClk_3$;
calculates a left eye width, given by $(TC-LC)*\Delta T$; and
calculates a right eye width, given by $(RC-TC)*\Delta T$.

8. The system of claim 7, wherein the phase interpolator clock is offset to the center position of the digital eye, denoted $PiClk_2$, by the software program performing the following operations:
programming a test access port controller operating according to a joint test action group standard to offset the phase interpolator clock to the center position;
configuring the digital eye width monitor to measure the time, TC, from the $PiClk_2$ to the reference clock;
selecting all gated ring oscillator clock phases, one by one, to count, wherein the software program issues a counting phase select signal to count each clock phase generated by an odd number of inversion stages of the gated ring oscillator; and
measuring, by the DEWM, the time, TC.

9. The system of claim 7, wherein the phase interpolator clock is offset to the left position of the digital eye, denoted $PiClk_1$, by the software program performing the following operations:
programming the test access port controller to offset the phase interpolator clock to the left position;
configuring the digital eye width monitor to measure the time, LC, from the $PiClk_1$ to the reference clock;
selecting all gated ring oscillator clock phases, one by one, to count, wherein the software program issues a counting phase select signal to count each of the odd number of phases of the gated ring oscillator; and
measuring, by the DEWM, the time, LC.

10. The system of claim 7, wherein the phase interpolator clock is offset to the right position of the digital eye, denoted $PiClk_3$, by the software program performing the following operations:
programming the test access port controller to offset the phase interpolator clock to the right position;
configuring the digital eye width monitor to measure the time, RC, from the $PiClk_3$ to the reference clock;
selecting all gated ring oscillator clock phases, one by one, to count, wherein the software program issues a counting phase select signal to count each of the odd number of phases of the gated ring oscillator; and
measuring, by the DEWM, the time, RC.

11. A system, comprising:
a phase interpolator to receive a reference clock and generate a phase interpolator clock;
a digital eye width monitor to receive the reference clock and the phase interpolator clock, the digital eye width monitor to measure a width of a digital eye being received into the system, the digital eye width monitor further comprising:
a gated ring oscillator to generate an odd number of sequential clock phases having a first predetermined gate delay between each sequential clock phase, wherein all sequential clock phases have a deterministic start from a fixed state with a repeatable sequence;
one or more cell-based interpolators to add clocks between the sequential clock phases of the gated ring oscillator, the added clocks resulting in a second predetermined gate delay, wherein the second predetermined gate delay is smaller than the first predetermined gate delay;
a first pair of counters to count the clocks received by the first of the two or more cell-based interpolators, resulting in a first clock count;
a second pair of counters to count the clocks received by the second of the two or more cell-based interpolators, resulting in a second clock count; and
a third pair of counters to count the clocks received by the gated ring oscillator, resulting in a third clock count, wherein the first pair, the second pair, and the third pair of counters receive clock phases from each of the odd number of sequential clock phases; and
a summing circuit to add together the first clock count, the second clock count, and the third clock count;
wherein the first pair, the second pair, and the third pair of counters count the number of clock edges that occur during a time period to be measured for each clock phase of the gated ring oscillator.

12. The system of claim 11, further comprising:
a software program to initialize one or more test access port (TAP) registers, the TAP registers being part of a state machine operable according to a joint test action group, the TAP registers under the control of the software program to control a position of the phase interpolator clock relative to the digital eye.

13. The system of claim 11, wherein the software program further:
generates a counting phase select to keep track of which phase of the gated ring oscillator is being counted by the counters.

14. The system of claim 11, wherein a TAP controller further:
generates a calibrate signal to calibrate the phase interpolator clock with the reference clock.

15. The system of claim 11, the one or more cell-based interpolators further comprising:
first and second cell-based interpolators coupled to the first odd-numbered clock phase and the second odd-numbered clock phase of the gated ring oscillator, the first and second cell-based interpolators to:
generate a first rising edge clock following the first odd-numbered clock phase; and
generate a first falling edge clock following the first rising edge clock; and
third and fourth cell-based interpolators coupled to the first even-numbered clock phase and the second even-numbered clock phase of the gated ring oscillator, the third and fourth cell-based interpolators to:
generate a second rising edge clock following the first even-numbered clock phase; and
generate a second falling edge clock following the second rising clock edge;
wherein the second rising and falling edge clocks generated by the cell-based interpolators causes the second predetermined gate delay of the gated ring oscillator to be about two picoseconds.

16. The system of claim 11, the one or more cell-based interpolators further comprising:
a first cell-based interpolator coupled to the first odd-numbered clock phase and the second odd-numbered clock phase of the gated ring oscillator, the first cell-based interpolator to:
generate a first rising edge clock following the first odd-numbered clock phase;
a second cell-based interpolator coupled to the first even-numbered clock phase and the second even-numbered clock phase of the gated ring oscillator, the second cell-based interpolator to:
generate a second rising edge clock following the first even-numbered clock phase;
wherein the second rising edge clock generated by the cell-based interpolators causes the second predetermined gate delay of the gated ring oscillator to be about three picoseconds.

17. The system of claim 15, further comprising:
a first latch feeding into the first pair of counters, the first latch to receive rising and falling edge clocks from a selected one of nineteen gated ring oscillator clock phases;
a second latch feeding into the second pair of counters, the second latch to receive the rising and falling edge of the first interpolated clock from the selected one of nineteen gated ring oscillator clock phases; and
a third latch feeding into a third pair of counters, the third latch to receive the rising and falling edge of the second interpolated clock from the selected one of nineteen gated ring oscillator clock phases.

18. The system of claim 11, wherein the digital eye width monitor further:
calibrates an average step between the reference clock and the phase interpolator clock by:
measuring a first phase interpolator clock rising edge to a rising edge of the reference clock to produce a first value, $C_1$, wherein the reference clock rising edge occurs before the phase interpolator clock rising edge;
measuring a second phase interpolator clock rising edge to the rising edge of the reference clock to produce a second value, $C_2$; and
obtaining the average step, $\Delta T$, using the following formula:
$\Delta T = T/(C_2 - C_1)$, wherein T is the period of the phase interpolator clock.

19. The system of claim 18, the digital eye further comprising a left location, a center location, and a right location, wherein a software program further:
offsets the phase interpolator clock to the center location of the digital eye, denoted $PiClk_2$;
measures the time, TC, from $PiClk_2$ to the reference clock, wherein the rising edge of the reference clock occurs before the rising edge of the $PiClk_2$;
offsets the phase interpolator clock to the left location of the digital eye, denoted $PiClk_1$;
measures the time, LC, from $PiClk_1$ to the reference clock, wherein the rising edge of the reference clock occurs before the rising edge of the $PiClk_1$;
offsets the phase interpolator clock to the right location of the digital eye, denoted $PiClk_3$;
measures the time, RC, from $PiClk_3$ to the reference clock, wherein the rising edge of the reference clock occurs before the rising edge of the $PiClk_3$;
calculates a left eye width, given by $(TC-LC)*\Delta T$; and
calculates a right eye width, given by $(RC-TC)*\Delta T$.

20. The system of claim 19, wherein the phase interpolator clock is offset to the center position of the digital eye, denoted $PiClk_2$, by the software program performing the following operations:
programming the phase interpolator clock to the center position;
configuring the digital eye width monitor to measure the time, TC, from the $PiClk_2$ to the reference clock;
selecting all gated ring oscillator clock phases, one by one, to count, wherein the software program issues a counting phase select signal to count each of the odd number of phases of the gated ring oscillator; and
measuring, by the DEWM, the time, TC.

21. The system of claim 11, wherein the gated ring oscillator has nineteen clock phases.

22. The system of claim 11, wherein the gated ring oscillator has five clock phases, the one or more cell-based interpolators further comprising:
first and second cell-based interpolators coupled between clock phases 0 and 2 of the gated ring oscillator;
third and fourth cell-based interpolators coupled between clock phases 1 and 3 of the gated ring oscillator;
fifth and sixth cell-based interpolators coupled between clock phases 2 and 4 of the gated ring oscillator;
seventh and eighth cell-based interpolators coupled between clock phases 3 and 5 of the gated ring oscillator;
ninth and tenth cell-based interpolators coupled between clock phases 4 and 0 of the gated ring oscillator; and
eleventh and twelfth cell-based interpolators coupled between clock phases 5 and 1 of the gated ring oscillator;
wherein the second predetermined gate delay is one third the first predetermined gate delay.

23. The system of claim 11, wherein the gated ring oscillator has five clock phases, the one or more cell-based interpolators further comprising:

a first cell-based interpolator coupled between clock phases 0 and 2 of the gated ring oscillator;

a second cell-based interpolator coupled between clock phases 1 and 3 of the gated ring oscillator;

a third cell-based interpolator coupled between clock phases 2 and 4 of the gated ring oscillator;

a fourth cell-based interpolator coupled between clock phases 3 and 5 of the gated ring oscillator;

a fifth cell-based interpolator coupled between clock phases 4 and 0 of the gated ring oscillator; and a sixth cell-based interpolator coupled between clock phases 5 and 1 of the gated ring oscillator;

wherein the second predetermined gate delay is one half the first predetermined gate delay.

24. The system of claim 11, wherein the gated ring oscillator has five clock phases, the one or more cell-based interpolators further comprising:

first and second cell-based interpolators coupled between clock phases 0 and 2 of the gated ring oscillator;

third and fourth cell-based interpolators coupled between clock phases 1 and 3 of the gated ring oscillator;

fifth and sixth cell-based interpolators coupled between clock phases 2 and 4 of the gated ring oscillator;

seventh and eighth cell-based interpolators coupled between clock phases 3 and 5 of the gated ring oscillator;

ninth and tenth cell-based interpolators coupled between clock phases 4 and 0 of the gated ring oscillator; and eleventh and twelfth cell-based interpolators coupled between clock phases 5 and 1 of the gated ring oscillator;

wherein the second predetermined gate delay is one third the first predetermined gate delay.

25. The system of claim 11, wherein the gated ring oscillator has five clock phases, the one or more cell-based interpolators further comprising:

a first cell-based interpolator coupled between clock phases 0 and 2 of the gated ring oscillator;

a second cell-based interpolator coupled between clock phases 1 and 3 of the gated ring oscillator;

a third cell-based interpolator coupled between clock phases 2 and 4 of the gated ring oscillator;

a fourth cell-based interpolator coupled between clock phases 3 and 5 of the gated ring oscillator;

a fifth cell-based interpolator coupled between clock phases 4 and 0 of the gated ring oscillator; and a sixth cell-based interpolator coupled between clock phases 5 and 1 of the gated ring oscillator;

wherein the second predetermined gate delay is one half the first predetermined gate delay.

\* \* \* \* \*